(12) United States Patent
Feng et al.

(10) Patent No.: US 7,723,844 B2
(45) Date of Patent: May 25, 2010

(54) HEAT DISSIPATION DEVICE HAVING A LOCKING DEVICE

(75) Inventors: Jin-Song Feng, Shenzhen (CN); Song-Shui Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 537 days.

(21) Appl. No.: 11/626,734

(22) Filed: Jan. 24, 2007

(65) Prior Publication Data

US 2008/0174968 A1   Jul. 24, 2008

(51) Int. Cl.
*H05K 7/20* (2006.01)
(52) U.S. Cl. ............... 257/718; 257/E23.086; 257/712; 257/713; 257/717; 257/720; 361/720; 361/704; 361/695; 361/697
(58) Field of Classification Search ......... 257/712–718, 257/E23.086; 361/720, 704, 695, 697
See application file for complete search history.

(56) References Cited

U.S. PATENT DOCUMENTS

| 5,477,916 | A | 12/1995 | Lin |
| 7,286,363 | B2 | 10/2007 | Lee et al. |
| 7,403,394 | B2 | 7/2008 | Chen |
| 2004/0032720 | A1* | 2/2004 | McHugh et al. ............. 361/719 |
| 2004/0212963 | A1* | 10/2004 | Unrein ........................ 361/704 |
| 2004/0228095 | A1* | 11/2004 | Lee et al. ..................... 361/704 |
| 2005/0045311 | A1* | 3/2005 | Chen et al. ............. 165/104.33 |
| 2005/0099780 | A1* | 5/2005 | Hornung ..................... 361/719 |
| 2006/0018097 | A1 | 1/2006 | Lee et al. |
| 2007/0079485 | A1* | 4/2007 | Lin et al. ....................... 24/458 |
| 2007/0139891 | A1* | 6/2007 | Yu et al. ...................... 361/704 |
| 2008/0106869 | A1* | 5/2008 | Li ................................ 361/704 |
| 2009/0056918 | A1* | 3/2009 | Li et al. ................. 165/104.33 |

FOREIGN PATENT DOCUMENTS

| TW | 516793 | 1/2003 |
| TW | M261979 | 4/2005 |
| TW | M293477 | 7/2006 |

* cited by examiner

*Primary Examiner*—Alexander O Williams
(74) *Attorney, Agent, or Firm*—Frank R. Niranjan

(57) ABSTRACT

A heat dissipation device includes a heat sink, a retention module and a locking device for securing the heat sink to the retention module. The heat sink includes a base for contacting with a heat-generating component. The retention module includes a bottom wall and a first spring clip secured at one side thereof. The locking device is pivotably connected to the retention module and includes a second spring clip attached thereon. The heat sink rests on the bottom wall of the retention module with an end thereof being pressed by the first spring clip, and an opposite end thereof being pressed by the second spring clip. The locking device can be at a released position where the locking device is pivotable, so that the heat sink is removable from the retention module, and a locked position where the locking device presses the base of the heat sink.

17 Claims, 6 Drawing Sheets

HEAT DISSIPATION DEVICE HAVING A LOCKING DEVICE

BACKGROUND OF THE INVENTION

1. Field of the Invention

The present invention relates generally to heat dissipation devices, and more particularly to a heat dissipation device having a locking device for securing a heat sink to a heat-generating component such as a central processing unit (CPU) mounted on a printed circuit board.

2. Description of Related Art

It is widely acknowledged that heat is produced during operations of electronic devices such as central processing units (CPUs). The produced heat must be quickly removed to ensure the CPUs working normally. Typically, a heat sink is disposed on the CPU to dissipate the heat therefrom.

In earlier times, linear-type locking devices were widely used for securing of heat sinks. A linear-type locking device, which is integrally made from a resilient metal wire, generally includes an elongated central pressing portion and a pair of locking arms extending from opposite ends of the elongated central pressing portion in opposite directions to thereby form a Z-shaped configuration. When assembled, the elongated central pressing portion of the linear-type locking device lodges in a heat sink, and the locking arms thereof are then resiliently deflected downwardly to engage with positioning means provided on a frame or socket to thereby secure the heat sink to a CPU. An example of a linear-type locking device is shown in U.S. Pat. No. 5,386,338. However, a linear-type locking device generally has a slim structure; it cannot firmly secure a heat sink to a CPU, especially nowadays the heat sink being made heavier and heavier aiming to obtain a high heat dissipating capacity.

Thus, an improved locking device which overcomes above-mentioned problems is required.

SUMMARY OF THE INVENTION

A heat dissipation device in accordance with a preferred embodiment of the present invention includes a heat sink, a retention module and a locking device for securing the heat sink to the retention module. The heat sink includes a base for contacting with a heat-generating component. The retention module includes a bottom wall and a first spring clip secured at one side thereof. The locking device is pivotably connected to the retention module and includes a second spring clip attached thereon. The heat sink rests on the bottom wall of the retention module with an end thereof being pressed by the first spring clip, and an opposite end thereof being pressed by the second spring clip when the locking device is locked to the retention module. The locking device can be at a released position where the locking device is pivotable and the heat sink is removable from the retention module, and a locked position where the locking device presses the base of the heat sink. Thus, the heat sink can be secured to the heat-generating component expediently.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
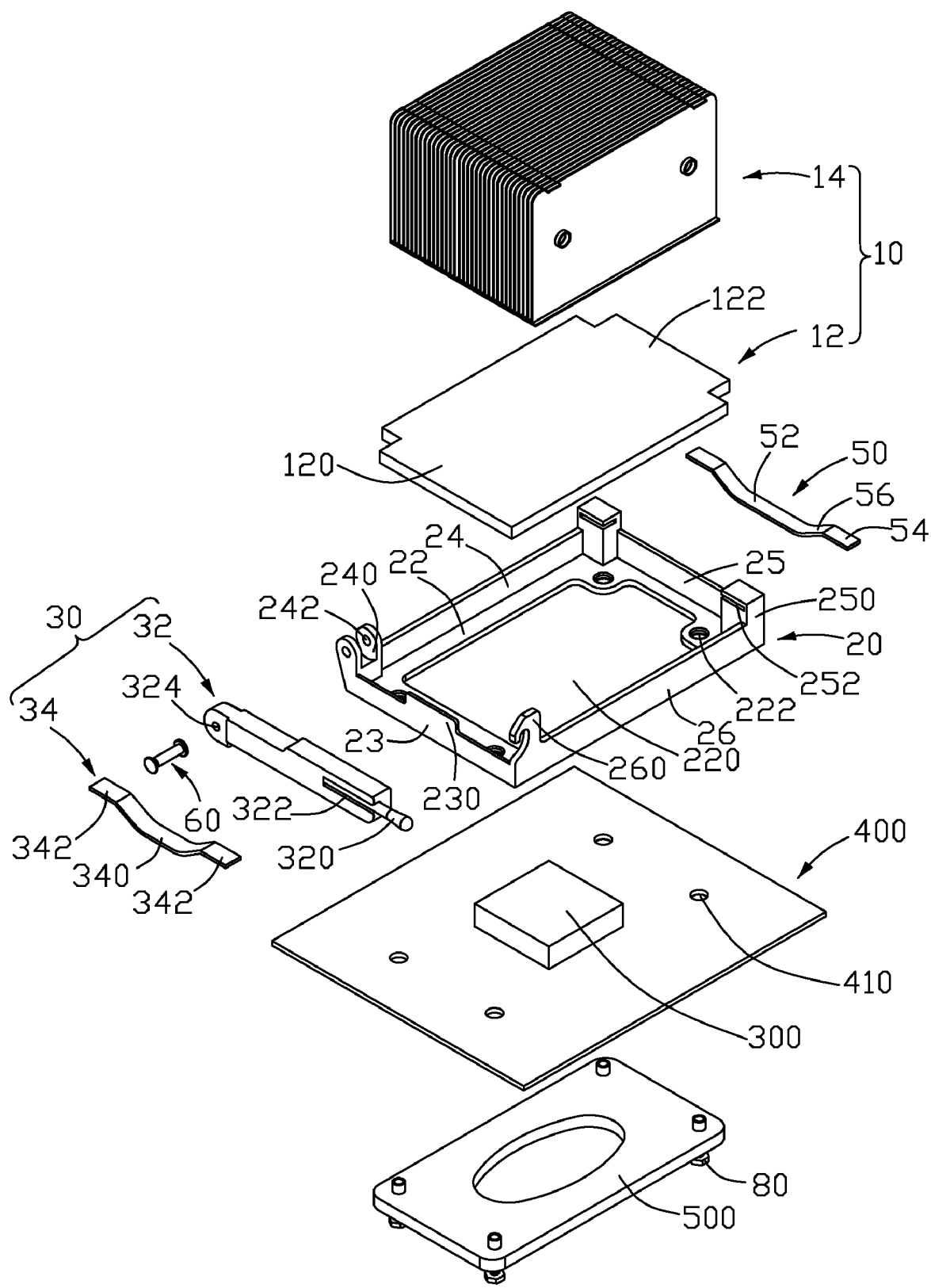
FIG. 1 is an exploded, isometric view of a heat dissipation device according to a preferred embodiment of the present invention, and a CUP mounted on a printed circuit board.

FIG. 1 illustrates a heat dissipation device in accordance with a preferred embodiment of the present invention, which comprises a heat sink 10, a retention module 20 and a locking device 30 for securing the heat sink 10 to a heat-generating component such as a CPU 300 mounted on a printed circuit board (PCB) 400. A back plate 500 is disposed under the PCB 400 and engages with the retention module 20 to sandwich the PCB 400 therebetween, whereby the retention module 20 can be securely fixed on the PCB 400 and surrounds the CPU 300.

The heat sink 10 comprises a base 12 and a plurality of heat-dissipating fins 14 to be mounted on the base 12 so that the fins 14 can extend vertically and upwardly from the base 12. Flange 120 and bulge 122 extend outward from opposite side edges of the base 12. There is no fin on the flange 120 and bulge 122 when the fins 14 are mounted to the base 12. The heat-dissipating fins 14 may be in any configuration known in the art, providing that they can effectively dissipate the heat produced by the CPU 300.

The retention module 20 is a substantially rectangular frame, which is located around the CPU 300, and comprises a bottom wall 22 defining an opening 220 in a center thereof for receiving the CPU 300. Four screw holes 222 are defined in four corners of the bottom wall 22 respectively, for fixing the retention module 20 to the printed circuit board 400. The retention module 20 has a first sidewall 23, a second sidewall 24, a third sidewall 25 and a fourth sidewall 26 extending upwardly from the bottom wall 22 to form a circumference thereof. The first and second sidewalls 23, 24 are arranged opposite to the third and fourth sidewalls 25, 26, respectively. The first sidewall 23 forms a blocking piece 230 extending upwardly from an upper side edge thereof. The second sidewall 24 forms two adjacent and parallel erect pivot tabs 240 at an end thereof close to the first sidewall 23, for pivotally connecting with the locking device 30. Each pivot tab 240 defines a pivot hole 242 therein for receiving a pivot 60 to connect the locking device 30 to the retention module 20. The third sidewall 25 forms a pair of positioning poles 250 extending upwardly from opposite end portions thereof. Each positioning pole 250 defines a receiving slit 252 in an inner side face thereof. The fourth sidewall 26 forms an ear 260 extending upwardly and outwardly from an upper side edge thereof and being opposite to the pivot tabs 240. The ear 260 is for engaging with the locking device 30 when the locking device 30 is moved to a locked position. A first spring clip 50, which is formed by stamping a resilient metal strap, comprises a pressing portion 52, a pair of connecting arms 56 extending slantwise and upwardly from two opposite ends of the pressing portion 52, respectively, and a pair of engaging portions 54 extending horizontally and outwards from free ends of the connecting arms 56, respectively. The engaging portions 54 of the first spring clip 50 are received in the receiving slits 252 of the positioning poles 250, respectively.

Figure 2:
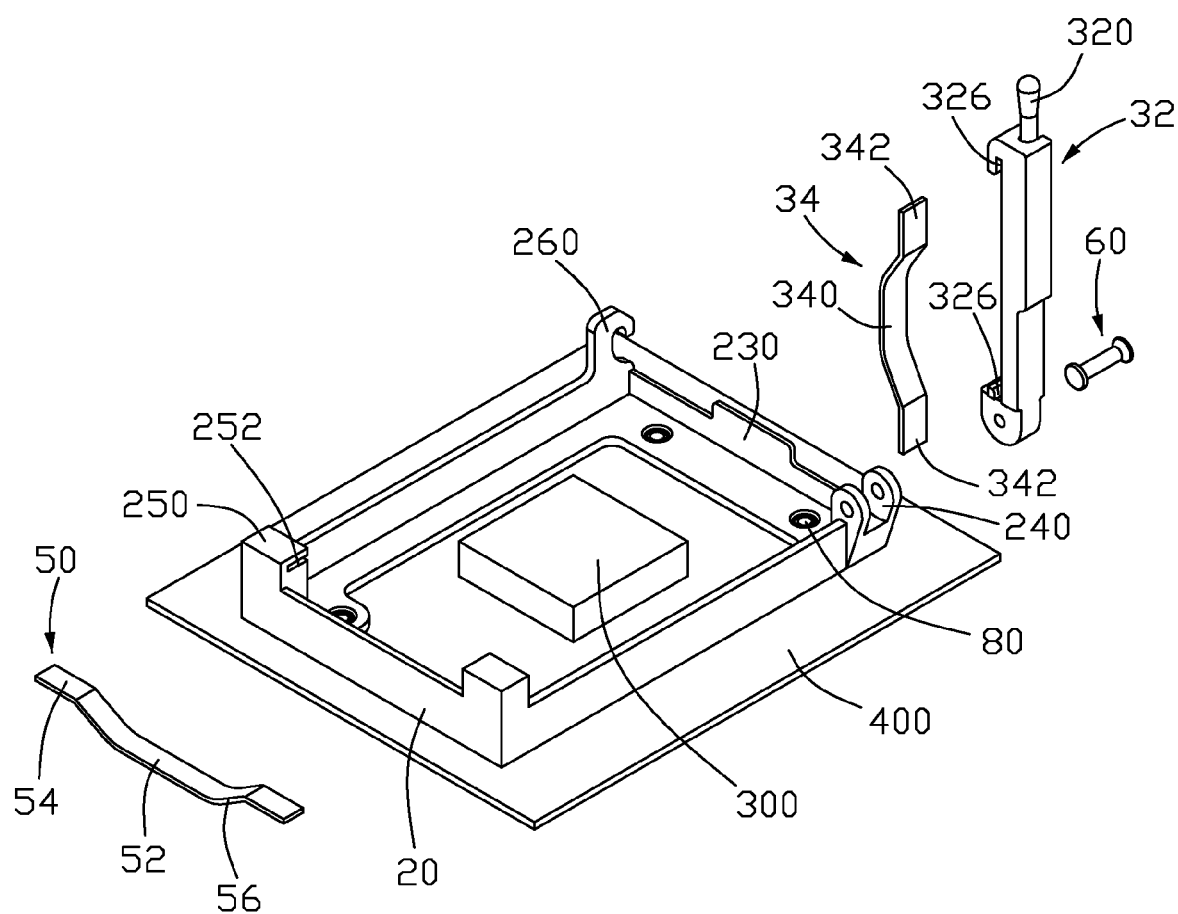
FIG. 2 shows a retention module mounted on the printed circuit board with the CPU of FIG. 1, and a locking device of the heat dissipation device from a different aspect.
Figure 3:
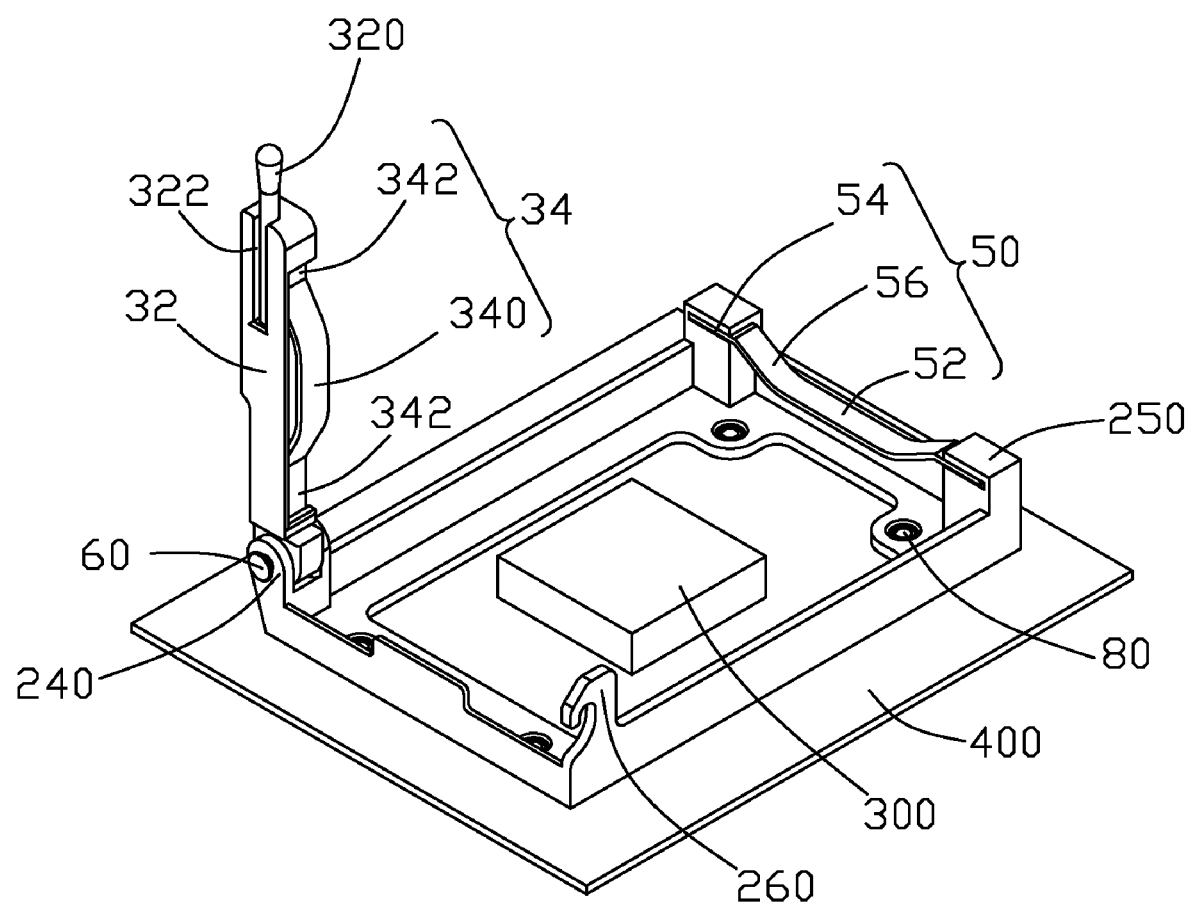
FIG. 3 is an assembled view of FIG. 2, but from an opposite aspect.
Figure 4:
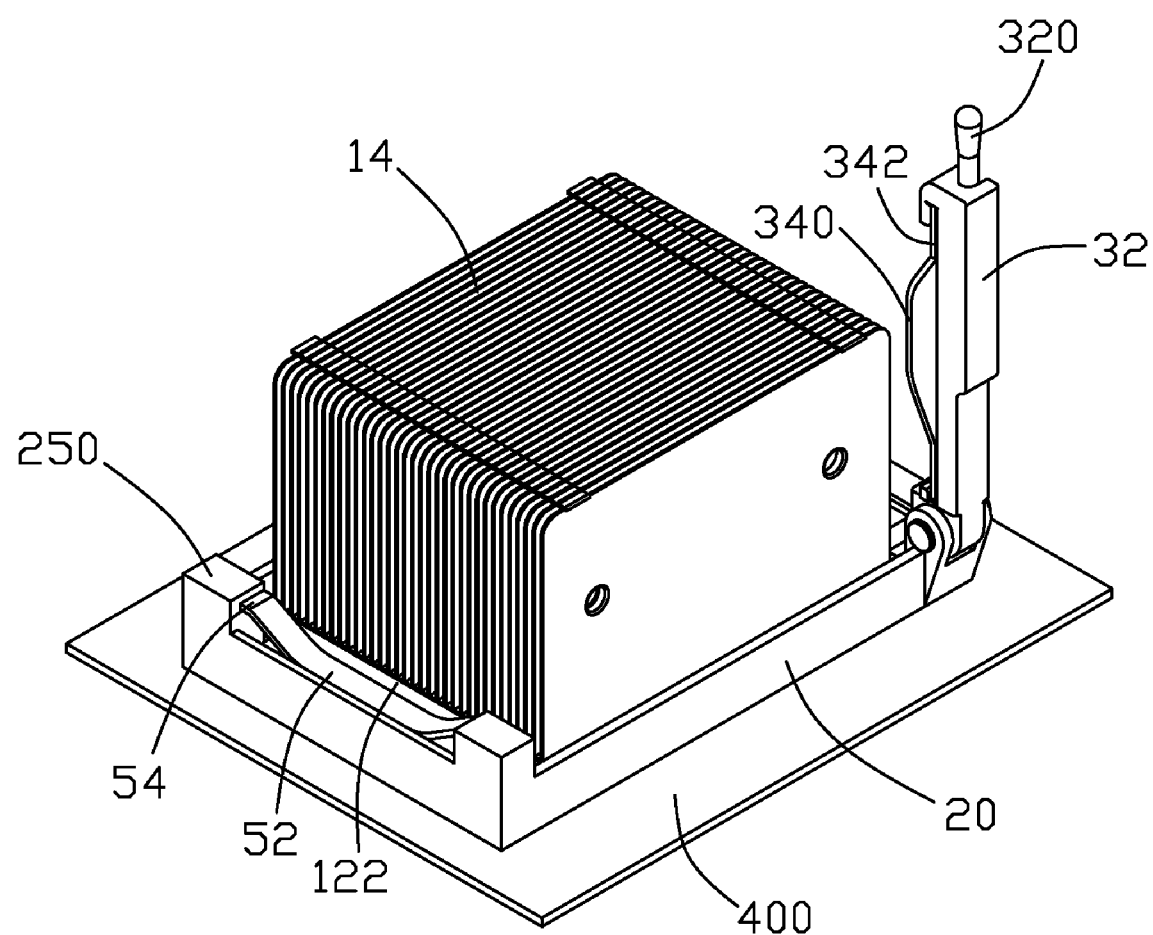
FIG. 4 is an assembled view of FIG. 1 with the locking device at an unlocked position.
Figure 5:
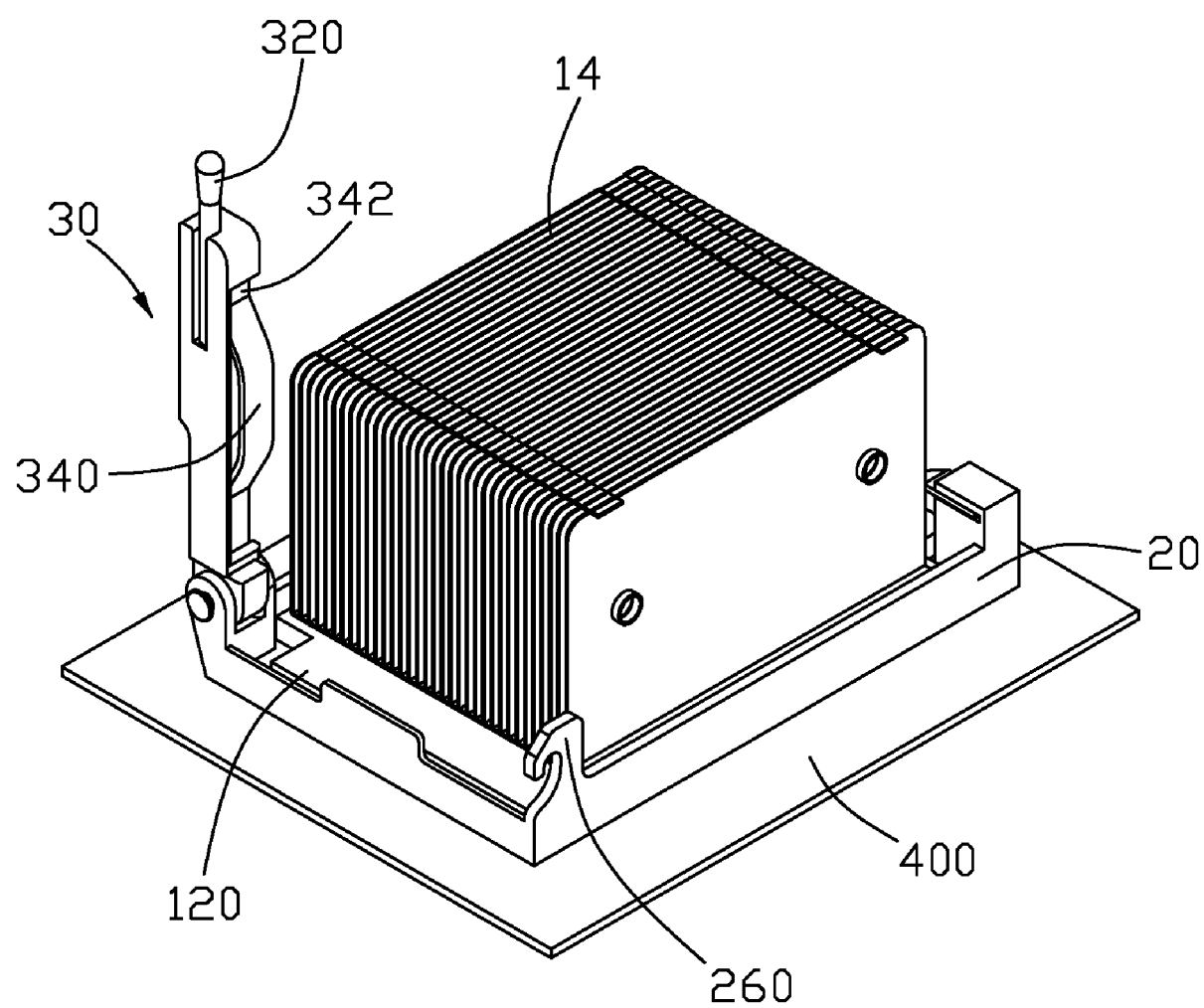
FIG. 5 is a view similar to FIG. 4 but from a different aspect.
Figure 6:
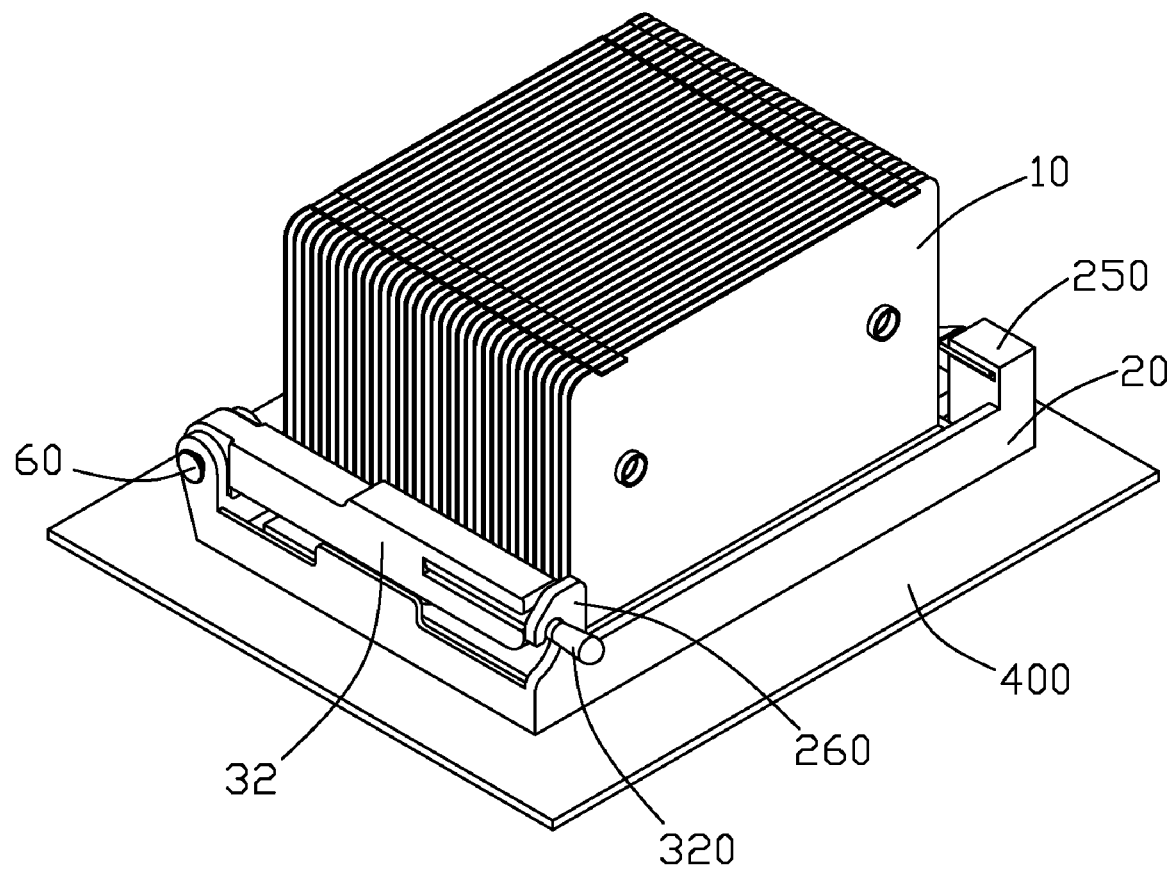
FIG. 6 is a view similar to FIG. 5, with the locking device moved to a locked position and engaging with the retention module.

The locking device 30 is pivotally assembled to the retention module 20 via the pivot 60 and is used to press the base 12 of the heat sink 10 towards the retention module 20 and the CPU 300. The locking device 30 comprises an operating member 32 and a second spring clip 34 positioned on the operating member 32. The operating member 32 comprises an elongated body (not labeled). The body has one end pivotablly connected to the pivot tabs 240 via the pivot 60 and an opposite end defining an elongated slot 322 therein. An operating handle 320 is inserted in the slot 322 for engaging with the ear 260 of the retention module 20. A through hole 324 is defined at the one end of the body of the operating member 32, for insertion of the pivot 60 therethrough. Also referring to FIG. 2, a pair of blocks (not labeled) are inwardly bent from bottom of opposite ends of the body of the operating member 32 such that a pair of corresponding locking recesses 326 are defined in opposite lateral sides of the operating member 32, for inserting two opposite ends of the second spring clip 34 therein. The second spring clip 34 with a structure similar to the first spring clip 50, comprises a pressing portion 340 a pair of connecting arms (not labeled) extending slantwise and upwardly from two opposite ends of the pressing portion 340 and a pair of engaging portions 342 extending horizontally and outwards from two free ends of the connecting arms. The engaging portions 342 of the second spring clip 34 are inserted in the locking recesses 326.

The PCB 400 has the CPU 300 mounted thereon and defines four holes 410 near four corners of the CPU 300, corresponding to the screw holes 222 of the retention module 20. Four screws 80 are extended through the back plate 500 and the holes 410 of the PCB 400 and screwed in the screw holes 222 of the retention module 20 to tightly sandwich the PCB 400 between the retention module 20 and the back plate 500.

Referring to FIGS. 3-6, in assembly, the heat sink 10 rests on the bottom wall 22 of the retention module 20, with a bottom surface of the base 12 contacting the CPU 300 and the bulge 122 of the base 12 is disposed between the first spring clip 50 and the bottom wall 22 of the retention module 20. The pressing portion 52 of the first spring clip 50 exerts a downward pressing force on the bulge 122 of the heat sink 10 to render the bulge 122 tightly abut against the bottom wall 22 of the retention module 20. The locking device 30 is pivotably connected between the two pivot tabs 240 of the retention module 20 via the pivot 60 being received in the pivot holes 242 and the through hole 324. Downwardly rotating the operating member 32 of the locking device 30, the operating handle 320 of the locking device 30 is moved to engage with the ear 260 of the retention module 20 with the operating handle 320 being locked at the ear 260. At this position, the pressing portion 340 of the second spring clip 34 is brought to downwardly press the flange 120 of the base 12 of the heat sink 10 on the bottom wall 22 of the retention module 20. Here, two opposite end portions of the base 12 of the heat sink 10 are pressed by the first and second spring clips 50, 34 to tightly abut against the bottom wall 22 of the retention module 20, whereby the heat sink 10 is securely retained in the retention module 20. Thus, the heat sink 10 is intimately attached to the CPU 300.

According to above embodiment of the invention, the first and second spring clips 50, 34 with the pressing portions 52, 340 pressing on the base 12 of the heat sink 10 have a large contacting area with the base 12 of the heat sink 10. Therefore, the heat sink 10 is more firmly secured in the retention module 20 via the first and second spring clips 50, 34 pressing on the base 12 of the heat sink 10, in comparison with a linear-type locking device generally with a slim structure. The locking device 30 is pivotally connected to the retention module 20, such that when the locking device 30 is at a released position, the locking device 30 is pivotable around the pivot 60, whereby the heat sink 10 is removable from the retention module 20. When at a locked position, the first and second spring clips 50, 34 downwardly press the base 12 of the heat sink 10 on the bottom wall 22 of the retention module 20. So, it is expedient to secure the heat sink 10 in the retention module 20 and attach the heat sink 10 to the CPU 300.

For removal of the heat sink 10 from the retention module 20, the operating member 32 is pressed and moved to disengage the operating handle 320 of the locking device 30 from the ear 260 of the retention module 20, and then the locking device 30 is pivoted upwardly so that the pressing portion 340 of the second spring clip 34 separates from the base 12 of the heat sink 10. Here, the pressing force of the locking device 30 acting on the base 12 of the heat sink 10 is released, and the heat sink 10 is removed from the retention module 20 with the bulge 122 being drawn out from the first spring clip 50. Thus, the disassembly of the heat sink 10 from the retention module 20 is also expedient.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink comprising a base adapted for contacting a heat-generating component;
   a retention module adapted for being located around the heat generating device, the retention module comprising a bottom wall and a first spring clip being secured at one side thereof; and
   a locking device pivotably connected to the retention module at an opposite side of the retention module and having a second spring clip being secured therein;
   wherein the base of the heat sink rests on the bottom wall of the retention module with an end portion of the base of the heat sink being pressed by the first spring clip, and an opposite end portion of the base of the heat sink being pressed by the second spring clip of the locking device, and the end portions of the base abut against the bottom wall of the retention module when the locking device is locked to the retention module, and wherein the locking device can be at a released position where the locking device is pivotable, so that the heat sink is removable from the retention module, and a locked position where the locking device presses the heat sink on the bottom wall of the retention module.

2. The heat dissipation device as claimed in claim 1, wherein the locking device comprises a pivot at one end thereof and the retention module at a side thereof forms at least one erecting pivot portion with at least one pivot hole defined therein and wherein the pivot is rotatably received in the at least one pivot hole.

3. The heat dissipation device as claimed in claim 2, wherein the locking device comprises an operating member and an operating handle secured in the operating member and wherein the second spring clip is positioned on the operating member.

4. The heat dissipation device as claimed in claim 3, wherein the retention module at an opposite side thereof forms an ear opposite to the at least one pivot portion, and the operating handle of the locking device is locked at the ear when the locking device is at the locked position.

5. The heat dissipation device as claimed in claim 4, wherein the second spring clip comprises a pressing portion exerting a pressing force on the base of the heat sink.

6. The heat dissipation device as claimed in claim 5, wherein the second spring clip further comprises a pair of engaging portions extending from two opposite ends of the pressing portion and fitting in the operating member.

7. The heat dissipation device as claimed in claim 6, wherein the engaging portions of the second spring clip fit in two locking recesses defined in the operating member, respectively.

8. The heat dissipation device as claimed in claim 1, wherein the first spring clip comprises a pressing portion exerting a pressing force on the base of the heat sink to render the base of the heat sink abutting against the bottom wall of the retention module.

9. The heat dissipation device as claimed in claim 1, wherein the retention module comprises a pair of positioning poles extending from opposite ends of the one side thereof and each positioning pole defines a receiving slit for receiving one of two opposite end portions of the first spring clip therein.

10. The heat dissipation device as claimed in claim 1, wherein each of the first and second spring clips is a resilient metal strap.

11. The heat dissipation device as claimed in claim 10, wherein the base comprises a bulge at one end thereof and a flange at an opposite end, and the bulge is pressed by the first spring clip to abut against the bottom wall of the retention module.

12. A heat dissipation device adapted for dissipating heat generated by an electronic device mounted on a printed circuit board, comprising:
   a retention module adapted for mounting on the printed circuit board and surrounding the electronic device, the retention module comprising a first spring clip disposed at one side of the retention module and a pair of positioning poles extending from opposite ends of the one side of the retention module, each positioning pole defining a receiving slit for receiving one of two opposite end portions of the first spring clip therein;
   a heat sink adapted for contacting with the electronic device, being mounted on the retention module and having a portion pressed by the first spring clip to abut against a bottom wall of the retention module; and
   a locking device having a first end pivotally connected to the retention module, a second end engaging with the retention module and a pressing portion between the first and second ends and exerting a pressing force on the heat sink toward the bottom wall of the retention module.

13. The heat dissipation device as claimed in claim 12, wherein the locking device comprises a pivot connected to the retention module and an operating handle engaging with the retention module.

14. The heat dissipation device as claimed in claim 13, wherein the retention module comprises an ear extending from a side edge thereof and the operating handle of the locking device is locked at the ear.

15. The heat dissipation device as claimed in claim 13, wherein the locking device comprises a second spring clip fitted therein and the second spring clip comprises the pressing portion exerting the pressing force on the heat sink towards the bottom wall of the retention module.

16. The heat dissipation device as claimed in claim 12, further comprising a back plate cooperating with the retention module to sandwich the printed circuit board therebetween.

17. A heat dissipation assembly comprising:
   a printed circuit board having a heat-generating electronic component mounted thereon;
   a back plate mounted under the printed circuit board;
   a retention module mounted on the printed circuit board, surrounding the heat-generating electronic component and securing with the back plate;
   a heat sink mounted on the retention module and thermally engaging with the heat-generating electronic component, the heat sink having a base plate and a plurality of fins extending upwardly from the base plate, wherein a bulge and a flange at two opposite lateral sides of the base plate are without the fins thereon; and
   a locking device having a first end pivotally mounted to the retention module, a second end locking with the retention module and a first spring clip located between the first and second ends and pressing the flange downwardly toward the electronic component;
   wherein the retention module has a second spring clip fixed therein and pressing the bulge downwardly toward the electronic component, and a pair of positioning poles extending from opposite ends of one side thereof, each positioning pole defining a receiving slit for receiving one of two opposite end portions of the second spring clip therein.

* * * * *